United States Patent [19]
Lee

[11] Patent Number: 5,828,709
[45] Date of Patent: Oct. 27, 1998

[54] APPARATUS AND METHOD FOR IMPROVING STABILITY OF TRANSMITTING FREQUENCY BY USING COSTAS LOOP SECTION IN COMMUNICATION SYSTEM OF HALF DUPLEX TRANSMITTING METHOD

[75] Inventor: Jin Seok Lee, Kyoungki-do, Rep. of Korea

[73] Assignee: Hyundi Electronics Industries Co., Ltd., Rep. of Korea

[21] Appl. No.: 525,092

[22] Filed: Sep. 8, 1995

[30] Foreign Application Priority Data

Dec. 30, 1994 [KR] Rep. of Korea .................. 1994-39869

[51] Int. Cl.⁶ ............................................... H04L 27/06
[52] U.S. Cl. .......................................... 375/344; 455/119
[58] Field of Search .................................... 375/295, 306, 375/254, 385, 296, 358, 371, 344; 331/12, 175; 329/308, 309; 332/103, 104; 455/113, 71, 260, 119

[56] References Cited

U.S. PATENT DOCUMENTS

| | | |
|---|---|---|
| 4,816,769 | 3/1989 | Ma et al. . |
| 4,980,652 | 12/1990 | Tarusawa et al. ........................... 331/1 |
| 5,233,626 | 8/1993 | Ames ...................................... 375/200 |
| 5,271,039 | 12/1993 | Suzuki .................................... 375/81 |
| 5,454,009 | 9/1995 | Fruit et al. .............................. 375/202 |
| 5,550,871 | 8/1996 | Lee ......................................... 375/344 |
| 5,701,602 | 12/1997 | Shimoda ................................. 455/260 |

FOREIGN PATENT DOCUMENTS 6-237277   8/1994   Japan .

OTHER PUBLICATIONS

Ralph Eschenbach Application of spread spectrum radio to indoor data communication, IEEE, 34.5–1–34.5–2, Mar. 1982.

*Primary Examiner*—Wellington Chin
*Assistant Examiner*—Jean B. Corrielus
*Attorney, Agent, or Firm*—Foley & Lardner

[57] ABSTRACT

An apparatus and a method for improving the stability of the transmitting frequency by using a costas loop section in a communication system of a half duplex transmitting method is disclosed, in which a receiving terminal is provided with an A/D converter, a D/A converter, a switching circuit, and a central processing unit, and thus, during a data transmission, a reference frequency is extracted through the costas loop section without installing a separate reference frequency extracting facility, thereby improving the stability of the transmitting frequency. In the conventional technique, in forming a reference frequency for a transmitting frequency, additional devices such as a pilot signal detector, a transmission reference frequency oscillator and the like are required, with the result that the cost for establishing the system becomes high, and that too much man hours and too many additional components are required. However, in the present invention, low cost facilities such as A/D and D/A converters, a switch circuit and a central processing unit are installed to the costas loop of the currently used receiving terminal, so that a transmitting reference frequency can be extracted from the data carrying carrier waves through the costas loop without using the high cost conventional reference frequency extracting facility, thereby improving the stability of the transmitting frequency.

3 Claims, 4 Drawing Sheets

APPARATUS AND METHOD FOR IMPROVING STABILITY OF TRANSMITTING FREQUENCY BY USING COSTAS LOOP SECTION IN COMMUNICATION SYSTEM OF HALF DUPLEX TRANSMITTING METHOD

BACKGROUND OF THE INVENTION

1. Field of the Invention

The present invention relates to an apparatus and a method for improving the stability of a transmitting frequency by using a costas loop section in a communication system that utilizes a half duplex transmitting method, in which a receiving terminal is provided with an A/D converter, a D/A converter, a switching circuit, and a central processing unit, and thus, during a data transmission, a reference frequency is extracted through the costas loop section without installing a separate reference frequency extracting facility, thereby improving the stability of the transmitting frequency.

2. Description of the Prior Art

Generally, in a satellite communication system using a half duplex transmitting method, the following method is used for determining the stability of the transmitting frequency during a data transmission.

First, if the received signals are analyzed, the signals include separate signals called pilot frequency. This pilot frequency is sent mixed in the data signals when a satellite sends data. This pilot frequency is used as a reference frequency when the data are to be sent again after receipt of them.

Therefore, when a set of data is sent again after receipt of it, there are two methods. One of them is to extract the pilot signals to send the data by using the extracted pilot signals as reference signals. Another method is to extract reference signals from the data forming clocks.

Besides, there is still another method. That is, the carrier waves carrying the data are used as the reference signals. In this case, the state of the frequency of the carrier waves, i.e., the deviation of the carrier frequency has to be continuously traced to reflect it during the data transmission.

However, of the above described methods, the method in which the pilot signals are extracted has to be provided with an additional circuit for detecting the pilot frequency, this additional circuit being of a completely separate constitution.

In the method in which the reference frequency is extracted from the data forming clocks, the received clocks are used as the reference frequency for an oscillator during a data transmission. Therefore, an oscillator for an exclusive use on transmission has to be added. In order to synchronize this oscillator to the reference clocks, there are needed many components.

In the third method in which the carrier waves are used, there is the limitation that the frequency deviation has to be continuously traced.

U.S. Pat. No. 5,271,039 discloses another technique relating a receiving terminal of a communication system based on a half duplex transmitting method. The apparatus of this invention includes: a means for providing phase modulated signals; a local oscillator for providing a sampling frequency; an A/D converter for converting the received phase modulated signals into digital signals by using the sampling clocks of the local oscillator; and a demodulating and local oscillation control means for demodulating the digital signals of the A/D converter by reproducing a reference symbol clock, and detecting a phase difference between the symbol clock and the sampling clocks of the local oscillator to control the local oscillator in order for the local oscillator to produce a pre-set frequency.

In this prior art, the A/D converter and the demodulating and local oscillation control means are used to control a local oscillating device of the receiving end. In this way, the phase difference between the sampling clock and the symbol clock is reduced to zero. Thus through the establishment of an exact synchronization, the received data can be accurately demodulated. However, when the data are to be transmitted again, the stability of the transmitting frequency is not ensured.

Of course, if a separate device for extracting the reference frequency (pilot signals) is used, then the stability can be established to a certain degree, but the economy is aggravated as mentioned above.

SUMMARY OF THE INVENTION

The present invention is intended to overcome the above described disadvantages of the conventional techniques.

Therefore, it is the object of the present invention to provide an apparatus and a method for improving the stability of the transmitting frequency, in which a low cost facility is installed to the costas loop of the currently used receiving terminal, so that a transmitting reference frequency can be extracted from the data carrying carrier waves through the costas loop without using the high cost conventional reference frequency extracting facility, thereby improving the stability of the transmitting frequency.

In achieving the above object, the apparatus for improving the stability of the transmitting frequency by using the costas loop according to the present invention includes between an integrator and a temperature compensating voltage control oscillator: a switch for selecting one signal from two signals inputted from an integrator and a D/A converter; an A/D converter for receiving output analogue signals of the switch through a voltage adjuster to convert them into digital signals; a voltage follower for eliminating mutual influences between the temperature compensating voltage control oscillator and the A/D converter, and for adjusting voltages inputted into respective terminals to a same level; a central processing unit for continuously storing an output of the A/D converter, and for controlling respective converters 25 and 30 and the switch; and a D/A converter for reading the output values of the central processing unit to convert them into analogue values during a data retransmission after receipt of them.

Prior to describing the present invention, the costas loop which is to be used in the present invention will be described first.

FIG. 1 illustrates the constitution of the costas loop for demodulating the modulated signals.

As shown in FIG. 1, the costas loop includes: a first phase detector 1 for demodulating inputted signals; a second phase detector 8; first and third low pass filters 2 and 9 for passing frequencies lower than blocked frequencies at output terminals of the first and second phase detectors 1 and 8; a multiplier 3 for outputting an output proportional to a multiple of the output signals of the first and third low pass filters 2 and 9; a second low pass filter 4 for filtering an output of the multiplier 3; an integrator 5 for outputting an integrated value proportional to the filtered signals of the second low pass filter 2; a temperature compensating voltage control oscillator (VCTCXO) 6 for generating an oscillation frequency by means of the control voltage to supply it to the respective phase detectors 1 and 8; and a 90-degree phase shifter 7 for phase-shifting an output of the temperature compensating voltage control oscillator 6 to supply an output to the second phase detector 8.

The costas loop constituted as described above is operated in the following manner.

First, an intermediate frequency $f_{IF}$ which is formed during the passing through an intermediate frequency means is inputted into the first and second phase detectors 1 and 8 of the costas loop respectively. Then the intermediate frequency is phase-compared by the respective phase detectors 1 and 8. Then the outputs of the respective phase detectors 1 and 8 pass through the low pass filters 2 and 9 respectively, and then, are inputted into the multiplier 3 to be multiplied there.

The signals multiplied by the multiplier 3 are filtered by the second low pass filter 4, and then, are inputted into the integrator 5 to be integrated there.

Then the signals are inputted into the temperature compensating voltage control oscillator 6 as a control voltage $v_t$, and then, the temperature compensating voltage control oscillator 6 outputs an oscillation frequency in accordance with the control voltage Vt to the phase detectors 1 and 8 and a frequency synthesizer. Under this condition, the oscillation frequency outputted from the temperature compensating voltage control oscillator 6 is inputted into the first phase detector 1 without modifications, while the frequency is supplied through the 90-degree phase shifter 7 to the second phase detector 8.

Thus the signals which are finally outputted from the first low pass filter 2 are inputted into the sampling section and a clock generator (not shown) to be demodulated into perfect digital signals.

Generally, in a half duplex transmitting method, the transmission and receiving cannot be carried out simultaneously, but are separated from each other in time. On the other hand, in a whole duplex transmitting method, the transmission and receiving can be carried out simultaneously, and the constitution of the whole duplex transmitting method is complicated compared with the half duplex transmitting method. In the whole duplex transmitting method, for example, two frequency synthesizers are needed to form a local oscillation frequency which is required during the transmission and receiving. Further, in the radio frequency device and in processing the data, complicated hardware and software are required.

Therefore, in the case of a simple data transmission and receiving without being accompanied by an audio information, the half duplex transmitting method can sufficiently satisfy the required functions. Therefore, for the sake of the simplification and compactness of the transmitting and receiving apparatus, the half duplex transmitting method is preferred rather than the whole duplex transmitting method.

In employing the half duplex transmitting method, during the transmission of data, the stability of the transmitting frequency should be adapted to fit the given characteristics.

In order to solve this problem, first the characteristics of the transmitting frequency will be reviewed. The transmitting frequency has a certain error tolerance range relative to the receiving frequency which is the reference value. This error tolerance range of the transmitting frequency is generally much smaller than the deviation of the receiving frequency, and this is as shown in FIGS. 2A and 2B. That is, FIG. 2A illustrates the error tolerance range of the receiving frequency. That is, FIG. 2A illustrates the frequency error tolerance range $\pm \Delta f_{RX}$ for the receiving signals based on the frequency $f_{RX(②)}$ of the receiving signals.

FIG. 2B illustrates the frequency error tolerance range of the transmitting signals. That is, FIG. 2B illustrates the frequency error tolerance range $\pm \Delta f_{TX}$ based on the frequencies ((①'), (②') and ((③')) of the transmitting signals.

That is, $f_{RX}+f'=f_{RX}+(f_{TX}-f_{RX})$, and therefore, this corresponds to $f_{TX(②')}$, $(f_{RX}+\Delta f_{RX})+f'=(f_{RX}+\Delta f_{RX})+(f_{TX}-f_{RX})$, and therefore, this corresponds to $fTX_{+\Delta f}RX$ ((③')), $(f_{RX}-\Delta f_{RX})+f'=(f_{RX}-\Delta f_{RX})+(f_{TX}-f_{RX})$, and therefore, this corresponds to $f_{TX}-\Delta f_{RX}$ ((①')).

In the above formulas, f' represents the difference between the receiving frequency and the transmitting frequency, i.e., $f_{TX}-f_{RX}$.

The respective transmitting frequencies ((①'), (②') and ((③')) corresponding to the receiving frequencies ((①), (②) and ((③)) can have an error tolerance range of $\pm \Delta f_{TX}$ respectively.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

A preferred embodiment of the present invention which is carried out in the above described ranges will be described referring to the attached drawings in detail.

Here, the components having the same constitutions as those of the conventional ones will be assigned with the same reference codes.

Figure 1:
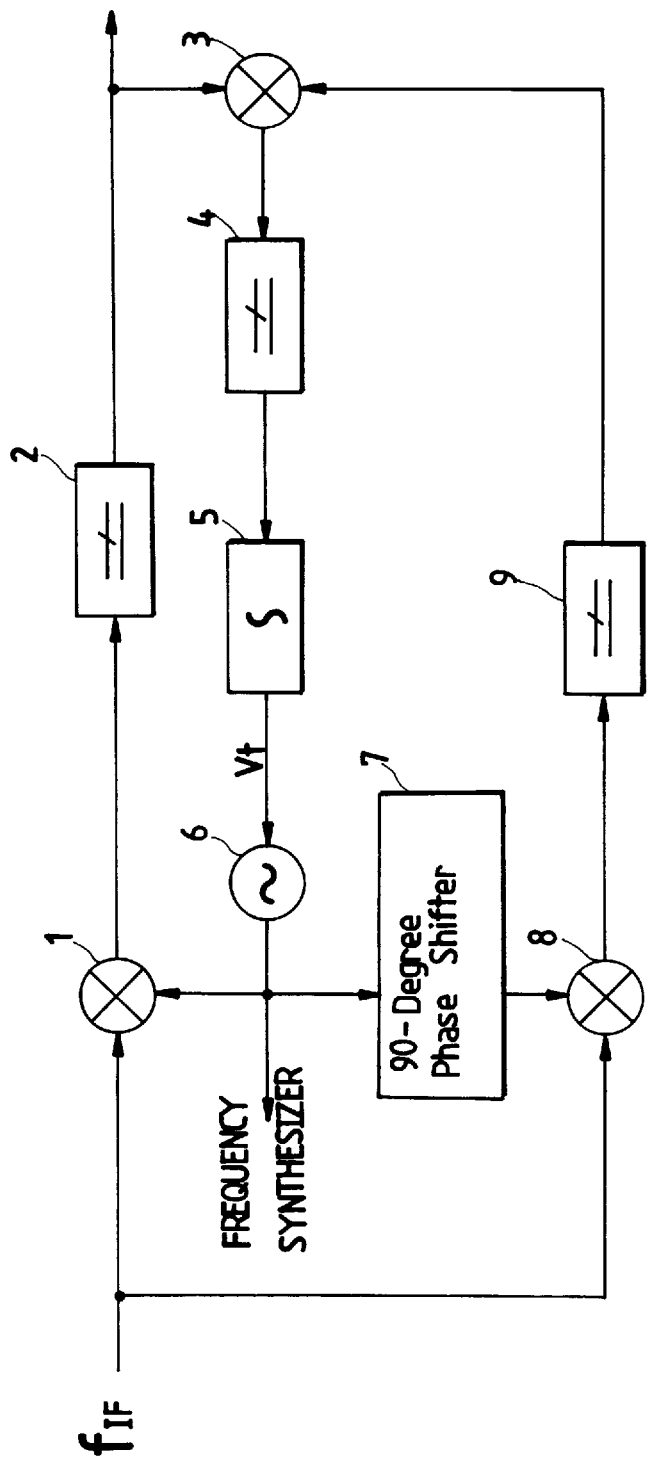
FIG. 1 is a block diagram showing the constitution of the costas loop of a general receiving terminal.
Figure 2A:
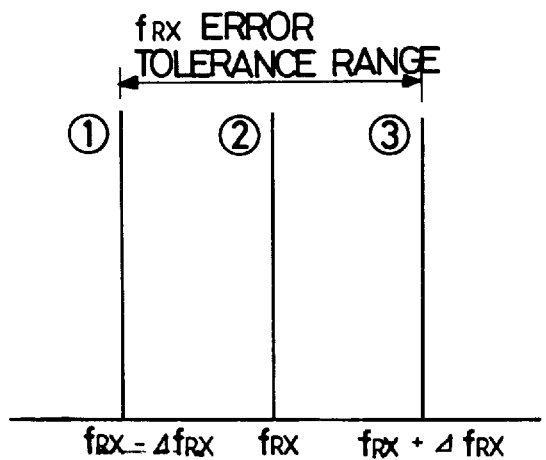
FIGS. 2A and 2B illustrate tolerance ranges for the transmitting and receiving frequencies.
Figure 2B:
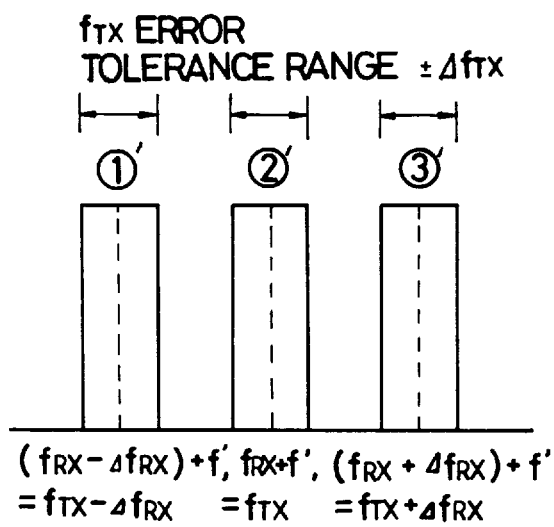
Figure 3:
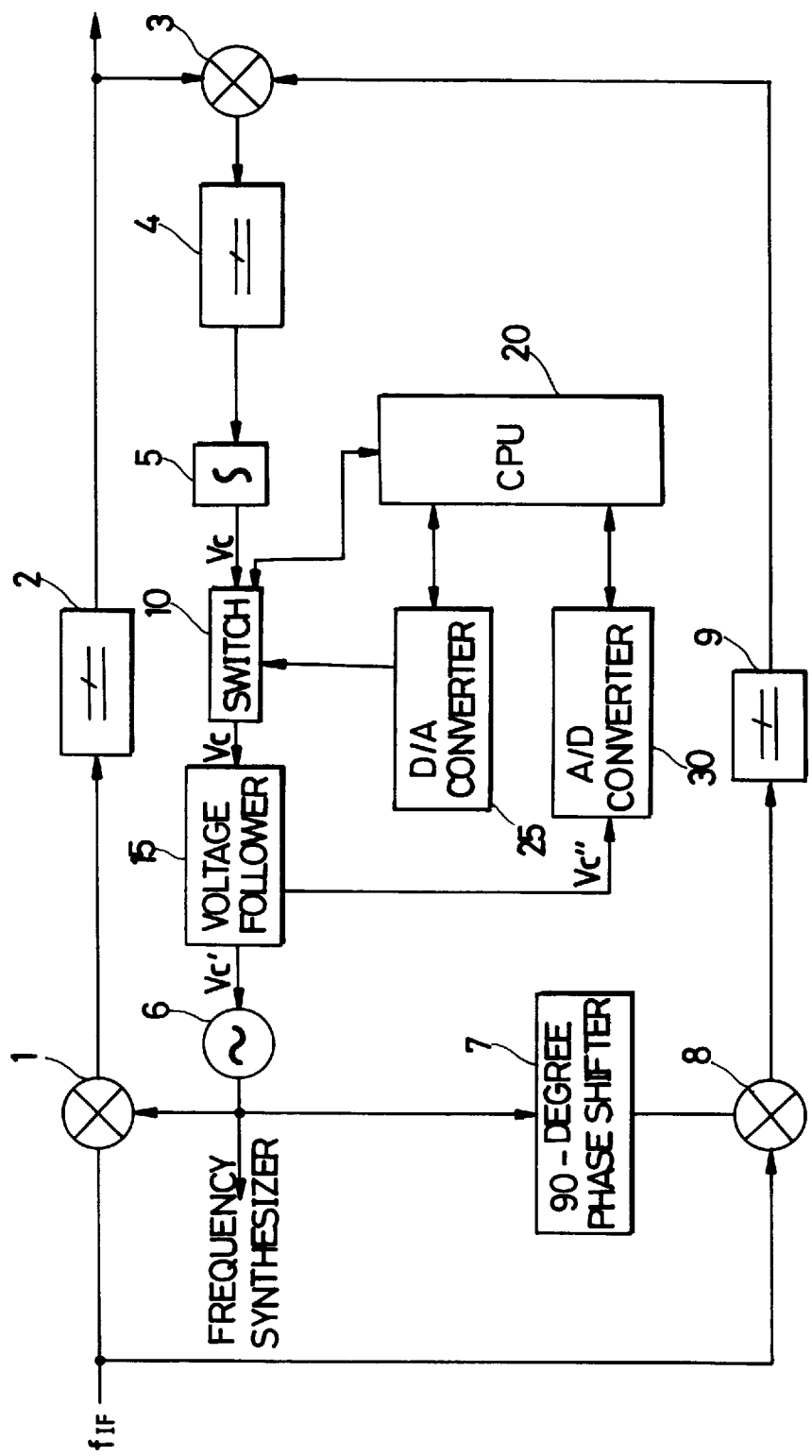
FIG. 3 is a block diagram showing the constitution of the apparatus according to the present invention.

FIG. 3 is a block diagram showing the constitution of the present invention.

As shown in this drawing, the apparatus of the present invention includes: a first phase detector 1 for demodulating inputted signals; a second phase detector 8; first and third low pass filters 2 and 9 for passing frequencies lower than blocked frequencies at output terminals of the first and second phase detectors 1 and 8; a multiplier 3 for outputting an output proportional to a multiple of the output signals of the first and third low pass filters 2 and 9; a second low pass filter 4 for filtering an output of the multiplier 3; an integrator 5 for outputting an integrated value proportional to the filtered signals of the second low pass filter 2; a switch 10 for selecting one signal from two signals inputted from an integrator and a D/A converter; an A/D converter 30 for receiving output analogue signals of the switch through a voltage adjuster to convert them into digital signals; a voltage follower 15 for eliminating mutual influences between a temperature compensating voltage control oscillator (VCTCXO) 6 and the A/D converter 30, and for adjusting voltages inputted into respective terminals to a same level; a central processing unit 20 for continuously storing an output of the A/D converter 30, and for controlling respective converters 25 and 30 and the switch; a D/A converter 25 for reading the output values of the central processing unit 20 to convert them into analogue values during a data retransmission after receipt of them; the temperature compensating voltage control oscillator (VCTCXO) 6 generating an oscillation frequency for the control voltage Vc' of the voltage follower 15 to supply it to the respective phase detectors 1 and 8; and a 90-degree phase shifter 7 for phase-shifting an output of the temperature compensating voltage control oscillator 6 to supply an output to the second phase detector 8.

The apparatus of the present invention constituted as above will now be described as to its operations.

An intermediate frequency which has been formed during the pass through an intermediate frequency terminal of the receiving end is inputted into the first and second phase detectors 1 and 8. (The intermediate frequency has the form of $\pm CosW_{IF}t$ in actual, but it is indicated by $f_{IF}$ for the simplification of description.) Then the intermediate frequency is phase-compared by the respective phase detectors 1 and 8. Then the intermediate frequency is outputted from the phase detectors 1 and 8 to pass through the respective low pass filters 2 and 9, and is inputted into the multiplier 3.

The signals multiplied by the multiplier 3 are supplied to the second low pass filter 4 to be filtered there, and then, are supplied to the integrator 5 to be integrated there. Then the signals are inputted into the switch 10 as control voltages Vc (the switch used here is HET4053 B which is a triple 2-channel analogue multiplexer/demultiplexer). Then the signals are switched suitably to the transmission and receiving status, and then, are inputted into the voltage follower 15. Then the switch 10 switches one of two sets of signals from the integrator 5 and the D/A converter 25 by the help of control signals of the central processing unit 20. Under this condition, the signals which are inputted into the switch 10 under a receiving mode are the signals which are outputted from the integrator 5. When carrying out a transmission, the signals which are inputted into the switch 10 are the signals outputted from the D/A converter 25.

First the basic operation when carrying out a receiving will be described. The signals Vc which are outputted from the integrator 5 are inputted into the voltage follower 15. Then the voltage follower 15 outputs the signals to both the temperature compensating voltage control oscillator 6 and to the A/D converter 30.

Under this condition, the two sets of the output signals Vc' and Vc" have the same value. This is due to the fact that the voltage follower 15 (which is LM358) eliminates the mutual influences between the temperature compensating voltage control oscillator 6 and the A/D converter 30, and carries out adjustments such that the outputted signals Vc' and Vc" should have the same value. In other words, Vc=Vc'=Vc" when carrying out a receiving, and Vc=Vc'=Vc" when carrying out a transmission.

Then the A/D converter 30 converts the signals into digital data to output them to the central processing unit 20. This data is in a continuously varying state, that is, it includes an information on the frequency deviation of a receiving carrier.

Therefore, this data is used when forming a reference frequency for during a transmission, i.e., a reference frequency for a frequency synthesizer.

Then the temperature compensating voltage control oscillator 6 outputs an oscillation frequency in accordance with the incoming control voltage Vc', and the outputted oscillation frequency is supplied to the respective phase detectors 1 and 8 and to the frequency synthesizer. Under this condition, the oscillation frequency is inputted into the first phase detector 1 without modification, while when it is inputted into the second phase detector 8, its phase is shifted by 90 degrees by the phase shifter 7.

Through the above operation, the signals which are finally outputted from the first low pass filter 2 are inputted into both the sampling section and the clock generator (not shown in the drawings) to be demodulated into digital signals.

Meanwhile, after the basic receiving operation, when the received data is to be transmitted again, the operation is carried out in the following manner.

Switching control signals which correspond to the transmitting situation are inputted from the central processing unit 20 to the switch 10. At the same time, the signals which have been inputted from the A/D converter 30 are supplied to the D/A converter 25.

The D/A converter 25 which have received these signals converts the signals into analogue signals to input them into the switch 10. These signals are outputted from the switch 10 to the temperature compensating voltage control oscillator 6, and ultimately this value is used by the frequency synthesizer for setting the transmitting frequency.

In an overall view, the above operation can be described as follows. That is, first the control voltage Vc which has been received from the integrator 5 during a receiving is converted into digital signals to be stored in the central processing unit 20. This value does not remain in a constant level, but can be varied in accordance with various surrounding factors. The factors are such that the frequency from the satellite can have an error range, or that the receiving apparatus can generate errors due to the variation of the ambient temperature and the doppler effect.

Due to the above described factors, the value of the control voltage Vc can be varied, and each time when the value is varied, the A/D converter 30 memorizes the varied value. Therefore, it can be said that the stored value traces the variation of the value all the time.

When the received data is transmitted in the above described manner, the transmission is made by reflecting the variation range on the transmitting frequency, with the result that the stability of the transmitting frequency is improved without adding a separate facility.

Then as described above, the value of the central processing unit 20 is read by the D/A converter 25 to output it to the temperature compensating voltage control oscillator 6, so that the frequency synthesizer can set the transmitting frequency by utilizing the value.

However, attention has to be given to the following fact. That is, in an ideal case, the value Vc which has been detected in the receiving signals is maintained at the same value during the transmission. However, there can be generated errors due to the characteristics of the A/D converter 30 and the D/A converter 25. These errors are closely related to the transmitting frequency, and therefore, care has to be exercised when selecting the A/D and D/A converters 30 and 25.

Figure 4A:
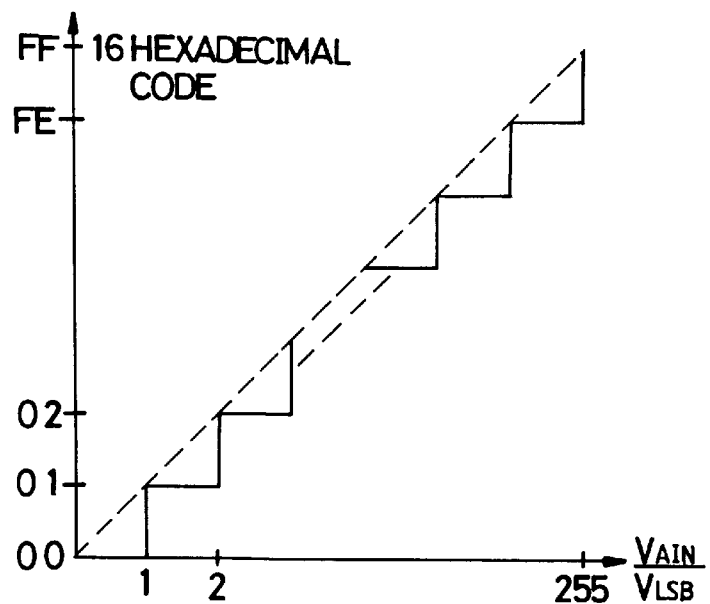
FIGS. 4A and 4B illustrate the errors liable to occur in the A/D converter or the D/A converter.
Figure 4B:
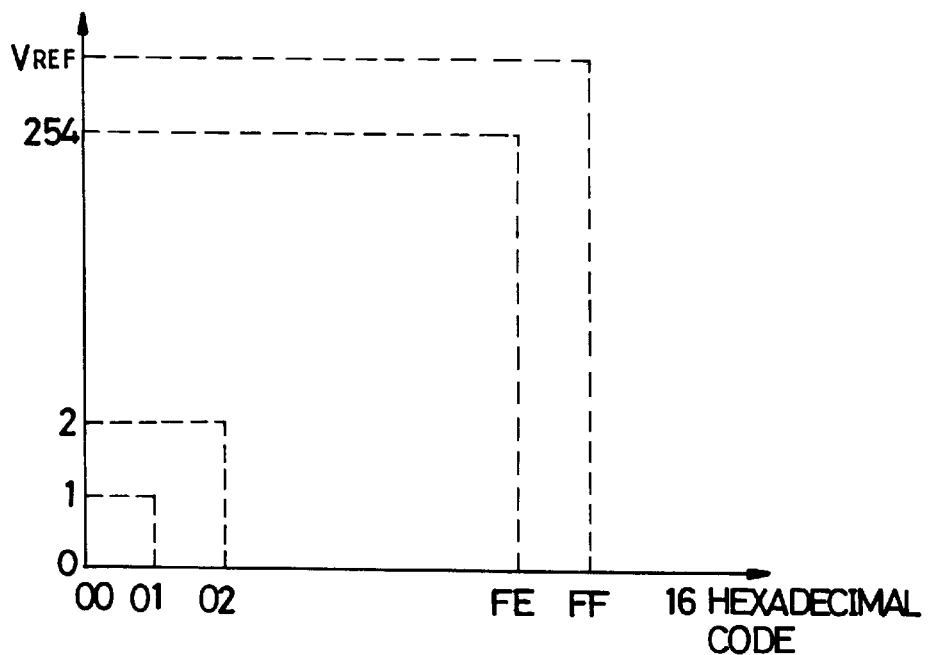

This relation will be described referring to FIGS. 4A and 4B.

During the A/D conversion, if 8 bits of binary data $D_0$–$D_7$ are expressed in a hexadecimal code, then the analogue input $V_{ALN}$ can be divided into 0–255 steps. Under this condition, the maximum error occurable can be expressed by $V_{LSB}=V_{REF}/255$.

Wherein $V_{REF}$ is maximum Value of analogue input $V_{AIN}$.

If $V_{ALN}$ is an integer times $V_{LSB}$, then the error becomes zero during the A/D and D/A conversions. Then the frequency error caused by the above described error can be expressed as follows.

$$\Delta f = \left[ f_o \times \left( \frac{\Delta f_T}{V_{REF}} \right) \right] \times V_{LSB}$$

In the above formula, the symbols denote as follows.

$\Delta f$: frequency error, $f_o$: output frequency of the temperature compensating voltage control oscillator in the normal state, $V_{REF}$: maximum Vc value, and $V_{LSB}$: maximum error voltage.

The actual transmitting frequency is formed into a much higher frequency by the frequency synthesizer based on the output frequency of the temperature compensating voltage control oscillator 6. If the relation between the output frequency of the temperature compensating voltage control oscillator and the actual transmitting frequency is as shown below, (N×Δf) becomes the actual transmitting frequency.

$$f_{TX} = N \times f_o$$

where, $f_{TX}$: transmitting frequency,

N: integer, and $f_o$: output frequency of the temperature compensating voltage control oscillator.

The value (N×Δf) has to satisfy the stability characteristics of the transmitting frequency. However, if other factors which can influence the transmitting frequency are taken into account, the above value has to be smaller than the mentioned characteristics. A value of ⅓ of the characteristics will be satisfactory.

According to the present invention as described above, A/D and D/A converters, a switch circuit and a central processing unit are installed on the costas loop section of the receiving terminal, so that the stability of the transmitting frequency can be satisfied without adding a separate facility.

What is claimed is:

1. In a system which provides half duplex communication, an apparatus for improving the stability of a transmitting frequency by using a costas loop, said apparatus being provided between an integrator and a temperature compensating voltage control oscillator and comprising:

a switch for selecting one signal from two signals input from said integrator and a D/A converter;

an A/D converter for receiving output analogue signals of said switch through a voltage follower to convert said output analogue signals into digital signals, said voltage follower eliminating mutual influences between said temperature compensating voltage control oscillator and said A/D converter and adjusting voltages input into respective terminals to a substantially same level;

a central processing unit for continuously storing an output of said A/D converter, and for controlling said A/D converter, said D/A converter, and said switch; and said D/A converter reading the output values of said central processing unit to convert said output values into analogue values during a data retransmission.

2. In a system which provides half duplex communication, a method for improving the stability of a transmitting frequency by using a costas loop, said costas loop including an integrator and a voltage controlled oscillator, the method comprising the steps of:

selecting with a switch an output analogue signal from two signals input from said integrator and a D/A converter;

receiving output analogue signals from the switch through a voltage follower and converting said output analogue signals into digital signals with an A/D converter;

eliminating mutual influences between said voltage, control oscillator and said A/D converter and adjusting voltages input into respective terminals to a substantially same level with said voltage follower;

continuously storing an output of said A/D converter; and converting the stored output of said A/D converter into analogue values during a data retransmission.

3. The method according to claim 2, wherein said voltage controlled oscillator is a temperature compensating voltage controlled oscillator.

\* \* \* \* \*